(12) United States Patent
Odani

(10) Patent No.: US 6,484,270 B1
(45) Date of Patent: Nov. 19, 2002

(54) ELECTRIC DEVICE WITH FLASH MEMORY BUILT-IN

(75) Inventor: Nobutsugu Odani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/304,519

(22) Filed: May 4, 1999

(30) Foreign Application Priority Data

Sep. 28, 1998 (JP) ............................................. 10-273231

(51) Int. Cl.[7] .................................................. G06F 11/00
(52) U.S. Cl. ............................................ 714/6; 711/103
(58) Field of Search ............................... 714/6, 2, 5, 7, 714/13, 20, 25, 39, 42, 47; 711/100, 103, 107

(56) References Cited

U.S. PATENT DOCUMENTS

| | | | |
|---|---|---|---|
| 5,351,216 A | | 9/1994 | Salt et al. ............... 365/230.01 |
| 5,418,752 A | | 5/1995 | Harari et al. ................ 365/218 |
| 5,488,711 A | | 1/1996 | Hewitt et al. ................ 395/430 |
| 5,515,333 A | * | 5/1996 | Fujita et al. ................. 365/229 |
| 5,524,230 A | * | 6/1996 | Sakaue et al. ............... 395/430 |
| 5,646,904 A | * | 7/1997 | Ohno et al. .................. 365/233 |
| 5,648,929 A | * | 7/1997 | Miyamoto ............. 365/185.04 |
| 5,694,538 A | | 12/1997 | Okazaki et al. ......... 395/182.13 |
| 5,715,431 A | | 2/1998 | Everett et al. ............... 395/483 |
| 5,768,162 A | * | 6/1998 | Rupp et al. .................. 365/579 |
| 5,793,774 A | | 8/1998 | Usui et al. .................. 371/21.2 |
| 5,809,515 A | | 9/1998 | Kaki et al. ..................... 71/103 |
| 5,978,941 A | * | 11/1999 | Katayama et al. ........... 714/721 |
| 6,134,628 A | * | 10/2000 | Hamadani ................... 711/103 |

* cited by examiner

*Primary Examiner*—Nadeem Iqbal
(74) *Attorney, Agent, or Firm*—Arent Fox Kintner Plotkin & Kahn PLLC

(57) ABSTRACT

An electrical device, in which can easily detect an operation status just before a stoppage of a power supply or an error occurrence when a system is returned, even if the power supply is cut off or the error occurs during executing program or erase operation, is provided. The electric device with a flash memory built-in including an auxiliary non-volatile memory for recording bus information for connecting the flash memory and a control section for controlling the flash memory. The auxiliary non-volatile memory is preferably to a memory, in which data write operation can be executed higher than the flash memory, for example, a ferroelectric RAM (FeRAM). The FeRAM, which is a memory using a polarization of ferroelectric, activates the same as that of a DRAM, and maintains recorded data, even if a power supply is cut off. Further, a time required to write data is higher than that of a non-volatile memory formed of a floating gate type of MOS transistor, which is used in the conventional flash memory.

9 Claims, 14 Drawing Sheets

FIG. 5

| Command Sequence | First bus cycle | | Second bus cycle | | Third bus cycle | | Fourth bus cycle | | Fifth bus cycle | | Sixth bus cycle | |
|---|---|---|---|---|---|---|---|---|---|---|---|---|
| | Address | Data | Address | Data | Address | Data | Address | Data | Address | Data | Address | Data |
| Read | 5555H | AAH | 2AAAH | 55H | 5555H | F0H | RA | RD | — | — | — | — |
| Program | 5555H | AAH | 2AAAH | 55H | 5555H | A0H | PA | PD | — | — | — | — |
| Chip Erase | 5555H | AAH | 2AAAH | 55H | 5555H | 80H | 5555H | AAH | 2AAAH | 55H | 5555H | 10H |
| Sector Erase | 5555H | AAH | 2AAAH | 55H | 5555H | 80H | 5555H | AAH | 2AAAH | 55H | SA | 30H |

Second Embodiment

ELECTRIC DEVICE WITH FLASH MEMORY BUILT-IN

BACKGROUND OF THE INVENTION

1. Field of the Invention

The present invention relates to an electric device, such as a memory card or a portable electric device, including a flash memory composed of a non-volatile memory, and a control section controlling the flash memory, by which a system can be recovered and the recovery operation can be accurately and easily performed, when the system is down because of a reason, such as a power failure or a system error occurrence.

2. Description of the Related Art

A portable electric device, such as a memory card or an electric palmtop computer, in which a flash memory is built, records data in the built-in flash memory, and reads the recorded data out as meeting the requirement. The flash memory is, generally, composed of a non-volatile memory having a floating gate type MOS transistor, in which a program operation for recording data, an erase operation for erasing data, and a read operation for reading data out are executed. In comparison with a read mode operation, a program or erase mode operation requires more time than the read mode operation, in general. However, as a flash memory is a non-volatile memory, in which the recorded data is maintained while an electric source is shutting out, it is well-known that the flash memory is suitable to use in an electric device, such as a memory card or portable electric device, used in a status where the use of the electric source has a limitation.

FIG. 13 is a structural diagram of the conventional comparatively small-scaled electric device, such as a memory card. The electric device 100 includes a main memory 2 composed of a flash memory 2, and a control circuit 1 for controlling the flash memory 2. The main memory 2 and the control circuit 1 are connected each other by a bus 4. The electric device 100 is attached to a personal computer to record user data in the main memory 2. To meet the requirement sent from the personal computer, the control circuit 1 supplies a command of several cycles to the main memory 2 through the bus 4, and the main memory 2 executes an erase or program operation in response to the supplied command.

FIG. 14 is a structural diagram of the conventional comparatively large scaled electric device, such as a portable electric device. The electric device 100 further includes a temporary memory 3, such as a DRAM or SRAM, by which data can be written in a comparatively higher speed, in addition to the control circuit 1 and the main memory 2 composed of a flash memory, which are described above. The temporary memory 3 is connected to the control circuit 1 through a bus 5 and temporary memory control line 6. Then, the temporary memory 3 composed of a volatile memory is connected to a buttery 8 to make it possible to maintain data, when the electric source is shut down.

When the control circuit 1 writes a data to the main memory 2 the write data is temporally written to the temporary memory 3, the write data temporally recorded in the temporary memory 3 is written to the main memory 2, which requires a comparatively long time to write data, with relatively longer time. Attribute information, such as bender information of the electric device 100, is also recorded in the temporary memory 3.

The above-described electric device where the conventional flash memory is built in has no way to obtain the status information, when an error occurs or an electric source is shut down during the program or erase operation, after the system is recovered. In case of the card memory, therefore, it requires to give functions of detecting the status, when an electric source is shut down or an error occurs while using a card memory, and of recovering from such situation to a card driver or file system of a personal computer. That also causes large load on the system side.

Although the memory card is useful to bring out, however, there is a problem such that an error can not be detected, when an error generating factor is included in the card memory. Thereby, a diversion of the card memory is lost.

In the case where a temporary memory 3 is included in an electric device as show in FIG. 14, it is also difficult to detect, after recovered the status when the program or erase operations for the main memory 2 is suspended because of a power failure or a system error occurrence, and there is the other problem to require too much time to recovery the system.

SUMMARY OF THE INVENTION

Accordingly, it is an object of the present invention to provide an electric device including a flash memory, in which error information can be easily detected after the system is recovered, and by which the memory can be easily recovered in a short time, even if program or erase operation is suspended because of a power source failure or system error occurrence.

It is another object of the present invention to provide an electric device including a flash memory, in which error information can be maintained when an abnormal operation is executed in the flash memory, and the memory can be earlier and easily recovered in a short time after executing the abnormal operation.

It is still another object of the present invention to provide an electric device including a flash memory, which can be continuously used, even if a defective bit is found while using the flash memory.

To achieve the above-described objects, an electric device with a flash memory built-in according to the present invention includes a flash memory, a control section for controlling the flash memory, and an auxiliary non-volatile memory, which records information of a bus for connecting the flash memory and the control section at a prescribed timing. The auxiliary non-volatile memory is preferably to a memory, which can write data in higher speed than the flash memory, for example, a ferroelectric RAM (FeRAM). The FeRAM is a memory using a polarization of a ferroelectric. In general, the FeRAM is activated as the same as a DRAM, and data recorded in the FeRAM is maintained when an electric source is shut down. Further, the operation for writing data in the FeRAM is executed in higher speed than that in a non-volatile memory formed of a floating gate type MOS transistor, which is used in the conventional flash memory.

To achieve the above-described objects, an electric device including a flash memory composed of a non-volatile memory and a control section connected to the flash memory through a bus for supplying control commands thereto through the bus and controlling the flash memory, further includes an auxiliary non-volatile memory, of which the write operation is executed in higher speed than that of the flash memory, wherein the control section records the bus information on the auxiliary non-volatile memory at a prescribed timing.

BRIEF DESCRIPTION OF THE DRAWINGS

FIG. 5 is an example of control commands.

DESCRIPTION OF THE PREFERRED EMBODIMENTS

Hereinafter, embodiments according to the present invention will be now explained in accompanying with the attached drawings. However, it should be understood that the technical scope of the present invention is not restricted to the embodiments.

Figure 1:
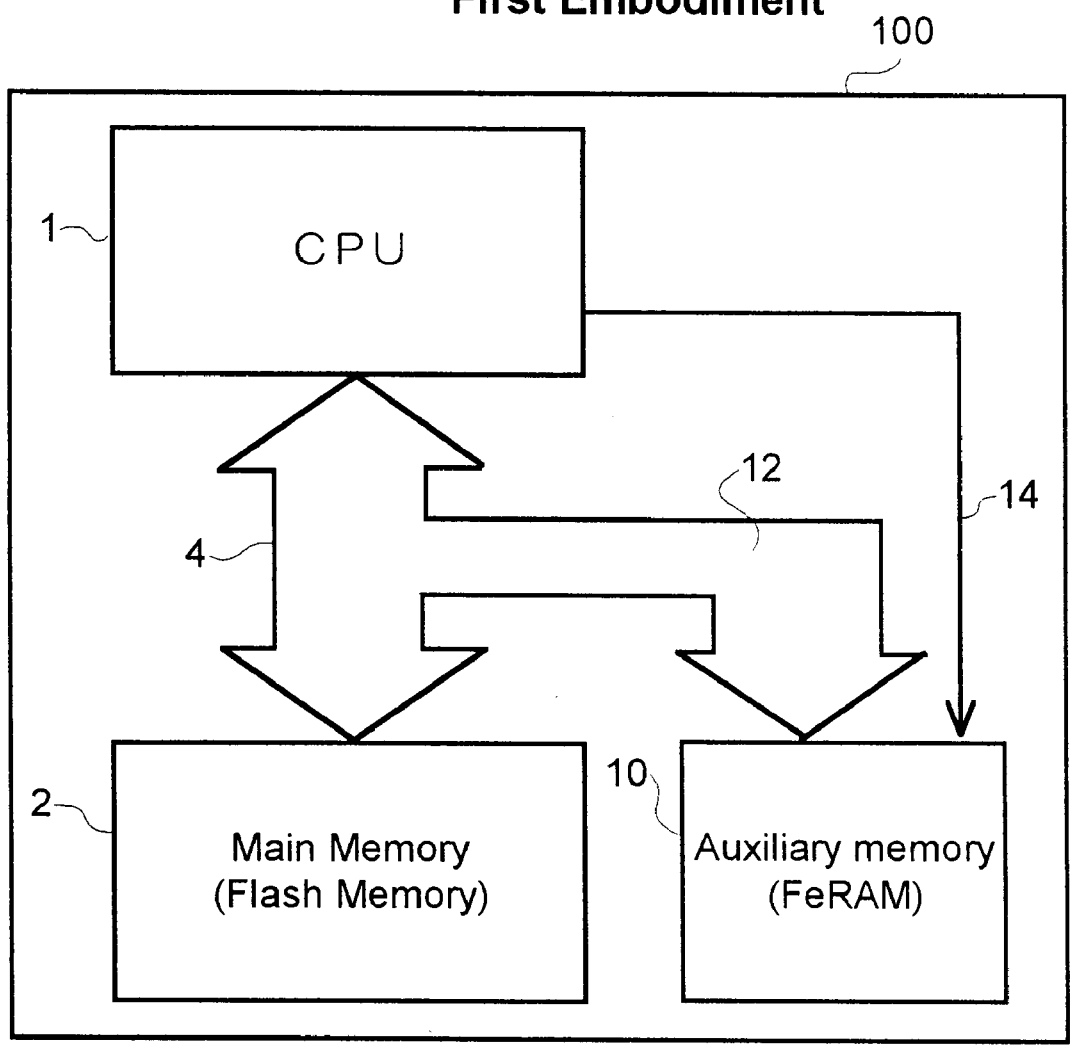
FIG. 1 is a structural diagram of an electric device of a first embodiment of the present invention.

FIG. 1 is a structural diagram of an electrical device of a first embodiment according to the present invention. As is shown in FIG. 1, the electric device 100 includes a main memory 2 composed of a flash memory, and a control circuit (CPU) 1 for controlling the main memory 2. The main memory 2 and the control circuit 1 are connected each other by a bus 4 having address and data signal lines. The electric device 100 further includes an auxiliary non-volatile memory 10 composed of a ferroelectric RAM (FeRAM), to which a bus 12 branched from the bus 4 is connected. Additionally, the auxiliary non-volatile memory 10 is controlled by a control signal 14 for ferroelectric RAM (FeRAM) sent from the control circuit 1.

The auxiliary non-volatile memory 10 is a memory, which uses a polarization function of a ferroelectric, for example, in which a ferroelectric is used for a gate oxidized film of a MOS type cell transistor to make a polarized condition by applying a voltage to the gate oxidized film and to give a function of a non-volatile memory by keeping the polarized condition, when an electric source is shut down. Data is read out through ON or OFF of the cell transistor according to the polarized condition. The time required for writing data to make the polarized condition is shorter than that in the flash memory using a floating gate type MOS transistor.

Figure 2:
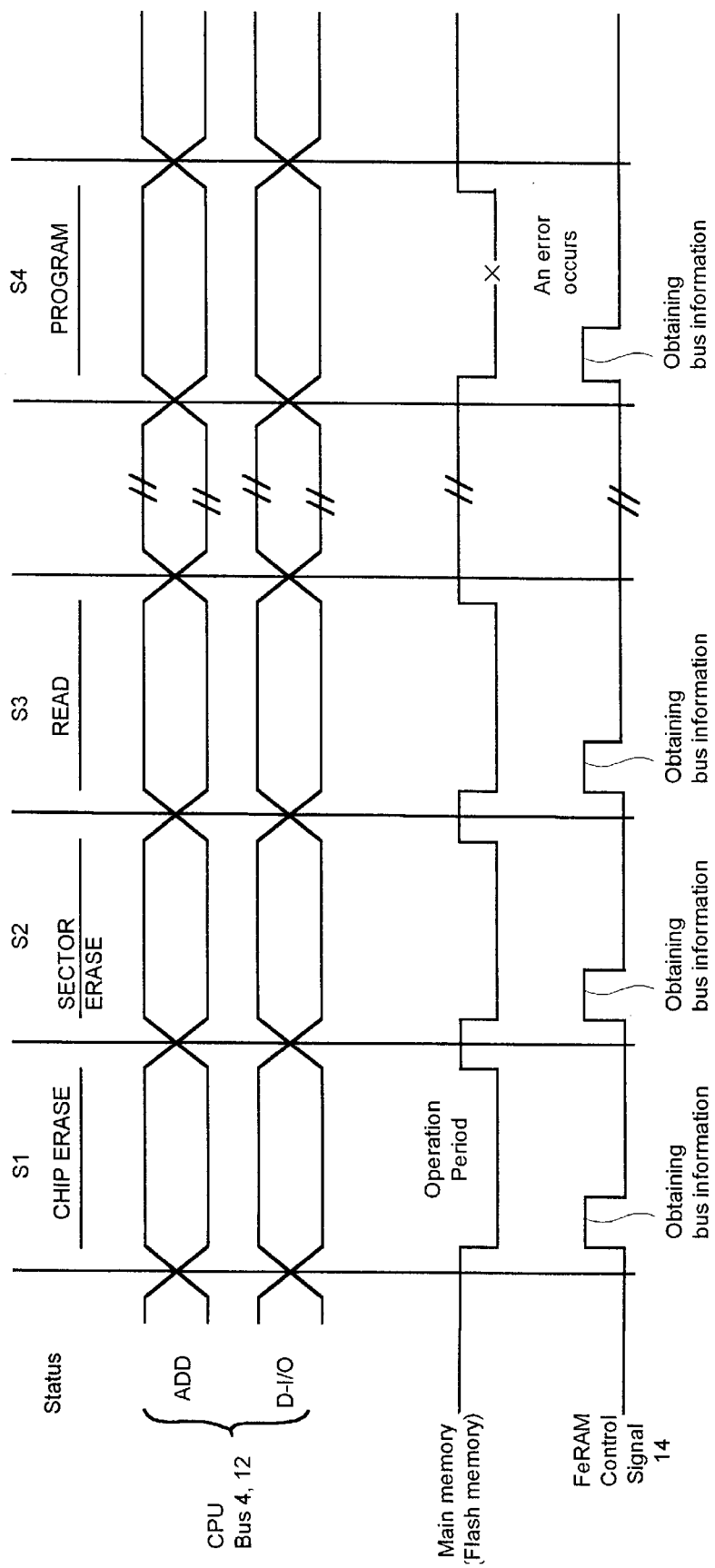
FIG. 2 is an operational timing chart of the electric device of FIG. 1.

FIG. 2 is an operational timing chart of the electric device of FIG. 1. A chip erase operation S1 for erasing a whole chip, a sector erase operation S2 for erasing in every one sector, a read operation S3 for reading data and a program operation S4 for programming the data as statuses of the flash memory device 2 are shown in FIG. 2 as examples. In each status, a control circuit 1, i.e., CPU, supplies a control command or an address to address and data buses of the bus 4. In response to the command or the address, the main memory 2 composed of a flash memory becomes active for each status.

For example, a control command is supplied to the bus 4 during the first half of an operation period of the flash memory 2 so that the flash memory 2 acknowledges the operation of the status. Therefore, the control circuit 1 supplies a FeRAM control signal 14 to the auxiliary non-volatile memory 10. In response to the control signal 14, the auxiliary non-volatile memory 10 records information of the bus 4. This bus information recording procedure is executed in every one status, and only the bus information in the latest status or in plural of the latest statuses is/are recorded on the auxiliary non-volatile memory 10. Consequently, there is no need to have a large storage capacity in the auxiliary non-volatile memory 10.

Assuming the operation is normally completed in each statuses S1, S2 and S3, and an error occurs or a power source is cut down, when executing the program procedure at a cycle S4 in the example of FIG. 2. When the power source of the electrical device 10 is supplied after that, the control circuit 1 reads the bus information just before the error occurrence recorded in the auxiliary non-volatile memory 10. Then, the control circuit 1 can know the status in the error occurrence time according to the recorded bus information of the error occurrence time. The status of the error occurrence time includes information of either of chip-erase, sector-erase, select and erase, read or program. When the status of the error occurrence time includes the sector erase or program, an address to be erased or to be programmed is also included in the information. That is, as the control circuit 1 can acknowledge to which address the erase or program operation was being executed at the error occurrence time, when the electric source is started up, the erasing or programming procedure can be started immediately after turning the power ON. In the conventional electric device, it is required to check contents of data recorded in the main memory and to detect an address to which cell is not programmed when turning the power source ON again, after an error occurs.

Further, in case when the error occurs not because of the shut down of the power source, but because of a defective program according to the use of a defective cell, the auxiliary non-volatile memory 10 records the address of the defective cell as a mask address. Using the mask address makes it possible to inhibit programming to the defective cell after that. This explanation will be described later in detail.

Only the latest bus information is recorded on the auxiliary non-volatile memory 10. Assuming the bus information is updated to the auxiliary non-volatile memory 10 in every one operation cycle. If the main memory 2 has a capacity of 4 Mbits and 16 input/output terminals I/O, the auxiliary non-volatile memory 10 is required to have a total capacity of 40 bits, i.e., 18 bits for an address bus, 16 bits for a data bus of input/output terminals and several bits for a control pin connected to the main memory 2.

When a memory card is used as the electrical device 100, for example, the electric device 100 is connected to different personal computers. In this case, the bus information on the previous error occurrence is maintained in the auxiliary non-volatile memory 10 of the memory card. Therefore, the user can read the information out at the different personal computer and acknowledge the status of the error occurrence time, thus the system reliability is improved.

Figure 3:
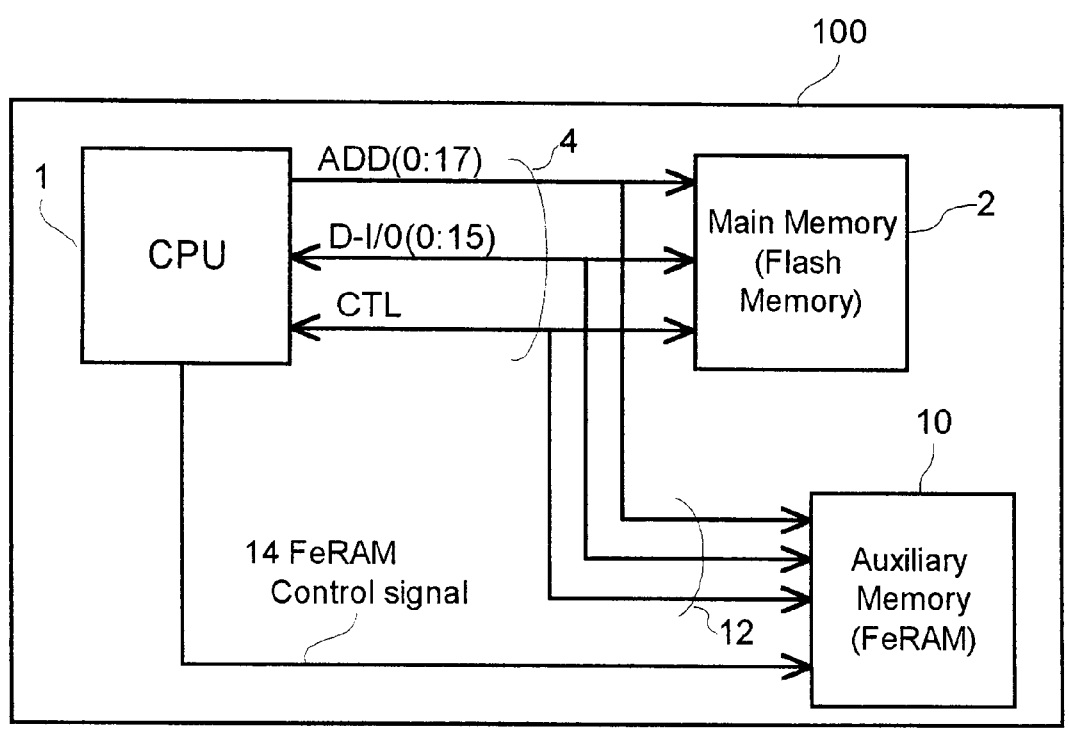
FIG. 3 is a detailed structural diagram of the electric device of the first embodiment.

FIG. 3 is a detailed structural diagram of the electric device of the first embodiment. In this example, a main memory 2 composed of a flash memory includes a capacity of 4 M bits, and a bus 4 includes 18 address buses ADD, 16 data buses D-I/O, and several control buses CTL. Each of the control buses CTL includes chip enable signal/CE, output enable signal/OE and write enable signal/WE, for example. These buses are further brunched, and the brunched buses 12 are also connected to the auxiliary non-volatile memory 10.

Figure 4:
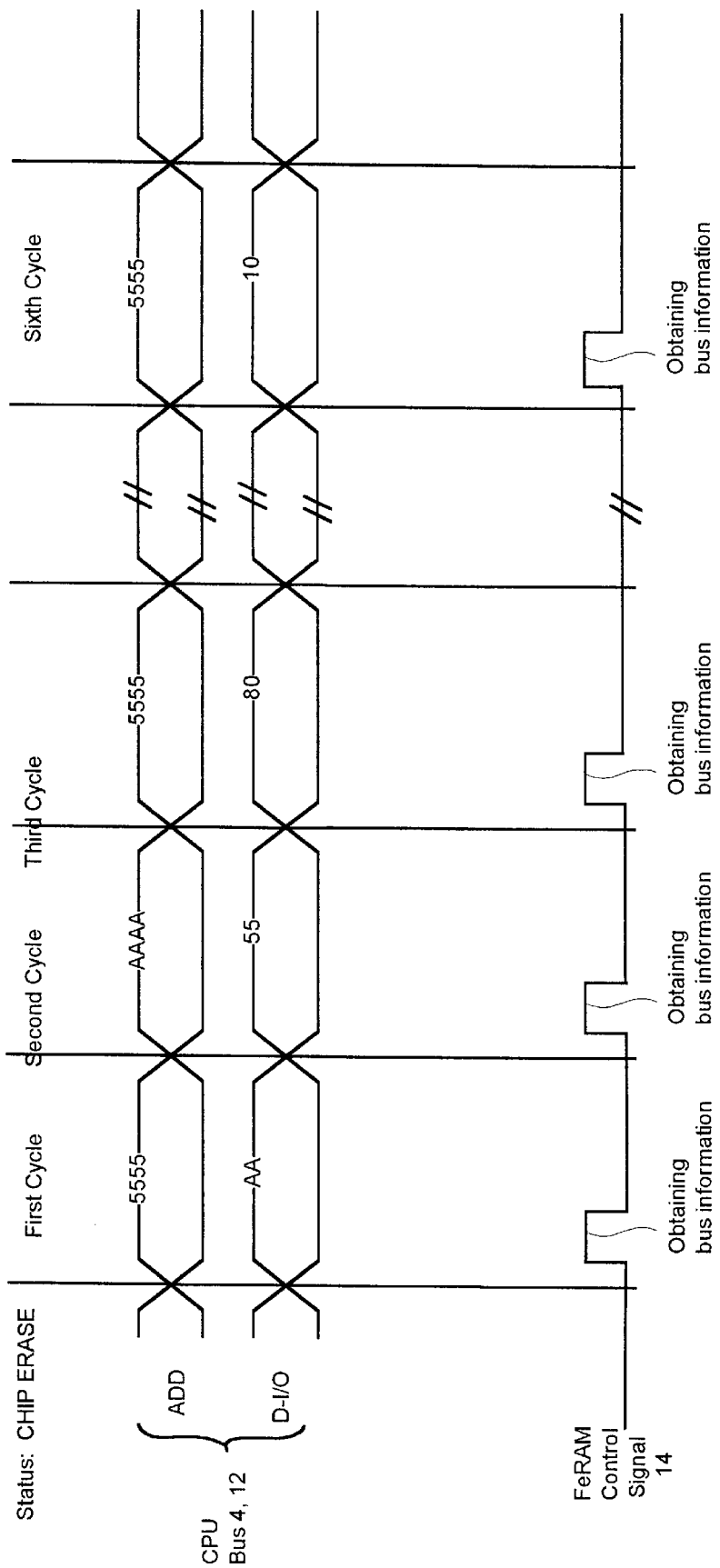
FIG. 4 is an operational timing chart of the electric device of FIG. 3.

FIG. 4 is an operational timing chart of the electric device shown in FIG. 3. FIG. 4 shows an example of a chip erasing procedures elected from plural operation statuses. As the chip erasing procedure erases important storage data, the control circuit 1 supplies a control command having six cycles to make the flash memory 2 acknowledge, in order not to erase the storage data because of a system error. In other words, control commands shown in FIG. 4 are supplied to an address bus ADD and a data bus D-I/O from the first cycle to the sixth cycle. The control circuit 1 makes the auxiliary non-volatile memory 10 record the control commands in every one cycle. That is, the control commands required for six cycles are recorded on the auxiliary non-volatile memory 10. After that, the entire chip erasing procedure is executed.

The above-described cycle for supplying the control commands requires about 100n seconds, for example, while the erasing procedure after the above-described cycles requires several seconds, for example. In other words, although the time for supplying command sequences of six cycles to the bus 4 is close to 600 n seconds, the erasing operation after that requires several seconds much longer than the command sequence supplying time. Therefore, as is explained in FIG. 2, the control commands supplied to the bus 4 are recorded in the auxiliary non-volatile memory 10 during the foregoing half section of the operation time of each status. Then, when the power supply is turned ON after the error, the control circuit 1 can easily detect the operation status just before the error occurrence, by analyzing control commands required for six cycles immediately before the error occurrence.

FIG. 5 shows an example of control commands. In the read operation, the flash memory 2 outputs read data RD to the data bus D-I/O in response to the control commands of three cycles and the read address RA at the fourth bus cycle. At the program operation, the flash memory 2 executes the program operation in response to control commands of three cycles and a program address PA and program data PD at the fourth cycles. The program operation requires to erase the programmed address once, to program after that, and to verify the program. Therefore, it requires more time than the command sequence. At the chip erase operation and the sector erase operation, control commands for six cycles are supplied to the flash memory 2, and the flash memory 2 executes the erase operation in response to those control commands. These two erase operations are distinguished by the control command of the sixth cycle. In the sector erase operation, a sector address SA is supplied at the sixth cycle.

As is apparent from the example shown in FIG. 5, by continuously recording the control commands output to the bus 4 in the auxiliary non-volatile memory 10 during the foregoing section of each status, the contents of the operation and the operated addresses PA and SA just before the error occurs can be read out, when the error occurs during the program or erase operation. Further, as the erased address is supplied to the bus 4 at and after the seventh cycle in the erase operation, it becomes possible to know the erased address just before the error occurrence by recording the erased address to the auxiliary non-volatile memory 10.

Figure 6:
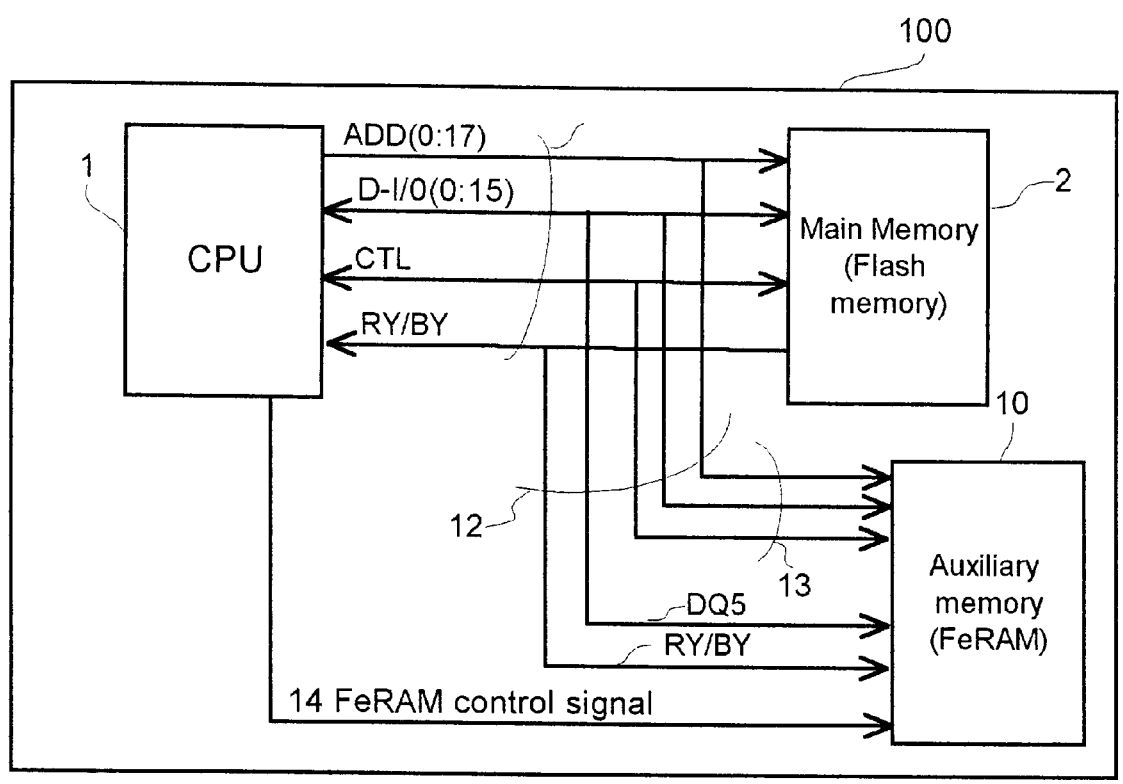
FIG. 6 is a structural diagram of an electric device of a second embodiment of the present invention.

FIG. 6 is a structural diagram of an electrical device of a second embodiment according to the present invention. In the second embodiment, a ready busy signal RY/BY and a timing limit over signal DQ5, both of which are flag signals included in the bus 4 and are supplied from the flash memory 2 to the control circuit 1, are also connected to the auxiliary non-volatile memory 10. Data of a bus line 13 including the address bus ADD, the data bus D-I/O and the control bus CTL in the bus 4 is recorded in the auxiliary non-volatile memory 10 as bus information.

Figure 7:
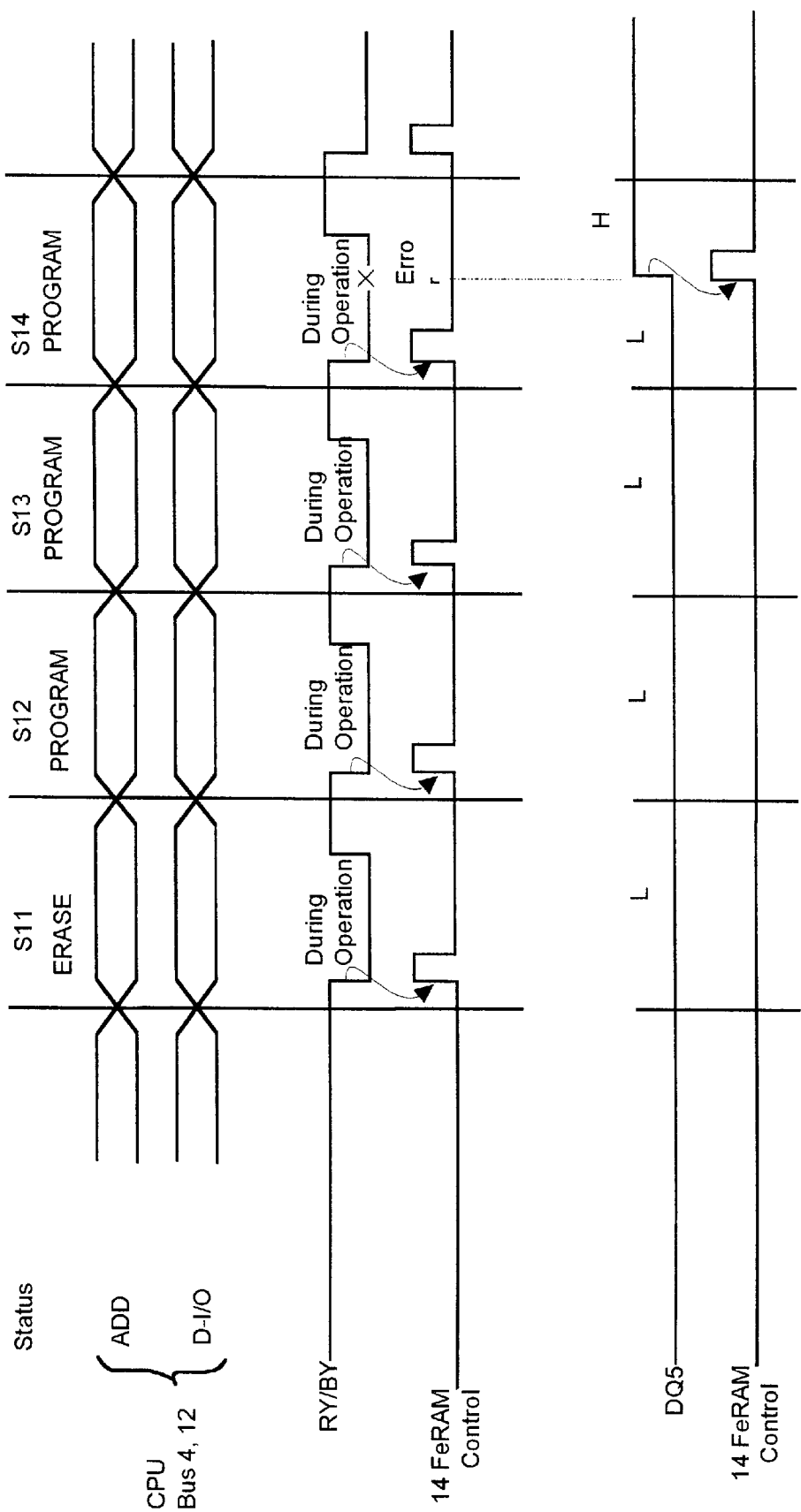
FIG. 7is an operational timing chart of the electric device of FIG. 6.

FIG. 7 is an operational timing chart of the electrical device shown in FIG. 6. Examples of an erase status S11, a program status S12, a program status S13 and a program status S14 are shown in FIG. 7. The above-described flag signals RY/BY, DQ5 are output from the flash memory 2 in the erase or program operation. As is apparent from FIG. 7, the ready busy signal RY/BY goes to level L while the erase or program operation is executing in the flash memory, and the ready busy signal RY/BY goes to level H after finishing the operation, for example. In the program operation, the ready busy signal RY/BY goes to level L at the fourth cycle of the command sequence shown in FIG. 5. In the erase operation, similarly, the ready busy signal RY/BY goes to level L at the sixth cycle of the command sequence shown in FIG. 5. After the completion of the operation, the signal goes to level H. This is shown in FIG. 7. Therefore, in response to the ready busy signal RY/BY, the control circuit 1 makes the auxiliary non-volatile memory 10 record the information of the bus 13 according to the FeRAM control signal 14. Thereby, the bus information after actually starting the erase or program operation is recorded in the auxiliary non-volatile memory 10. As the result, the operation history just before the error occurs can be read out from the auxiliary non-volatile memory 10, when an error occurs.

The flash memory 2 outputs the timing limit over signal DQ5, which is the other flag signal, when the program or erase operation time exceeds a predetermined time. As level L of the timing limit over signal DQ5 means the operation time does not exceed the prescribed time, it means that each erase or program operation is executing appropriately, as long as the signal DQ5 is level L during each operation time of each status. Further, as is shown in the status S14 of FIG. 7, if the signal DQ5 goes to level H during the program operation, this means a program error occurs. Therefore, the control circuit 1 makes the auxiliary non-volatile memory 10 record the bus information according to the FeRAM control signal 14, in response to the change of the signal DQ5 from level L to level H. As the result, information of an address where the program error occurs can be recorded in the auxiliary non-volatile memory 10.

By using the recorded address when the error occurs, it becomes possible to reprogram from the recorded address on to inhibit executing the program again at the address where the error occurs.

It is also possible to record more detailed error information in the auxiliary non-volatile memory 10 by recording both the bus information in response to the ready busy signal RY/BY and the bus information in response to the timing limit over signal DQ5.

Figure 8:
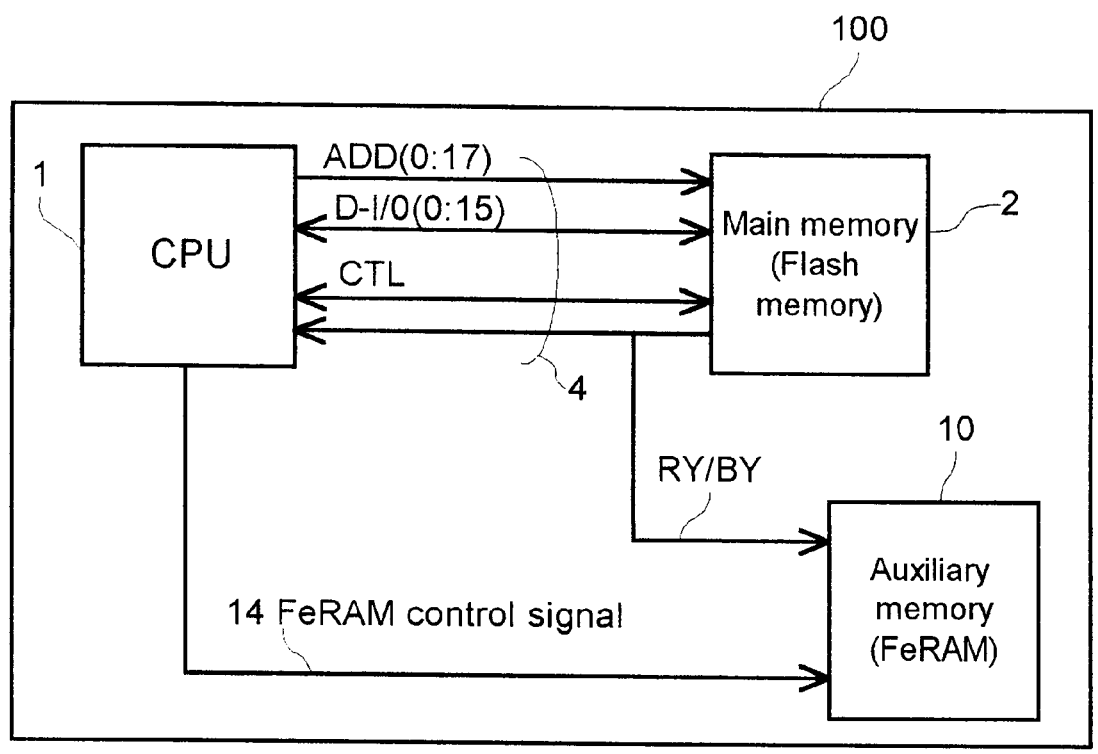
FIG. 8 is a structural diagram of an electric device of a third embodiment according to the present invention.

FIG. 8 is a structural diagram of an electrical device of a third embodiment of the present invention. In the third embodiment, a history of the above-described ready busy signal RY/BY, among the bus 4 connecting the control circuit 1 to the main memory 2, is recorded in the auxiliary non-volatile memory 10, in response to the FeRAM control signal 14.

Figure 9:
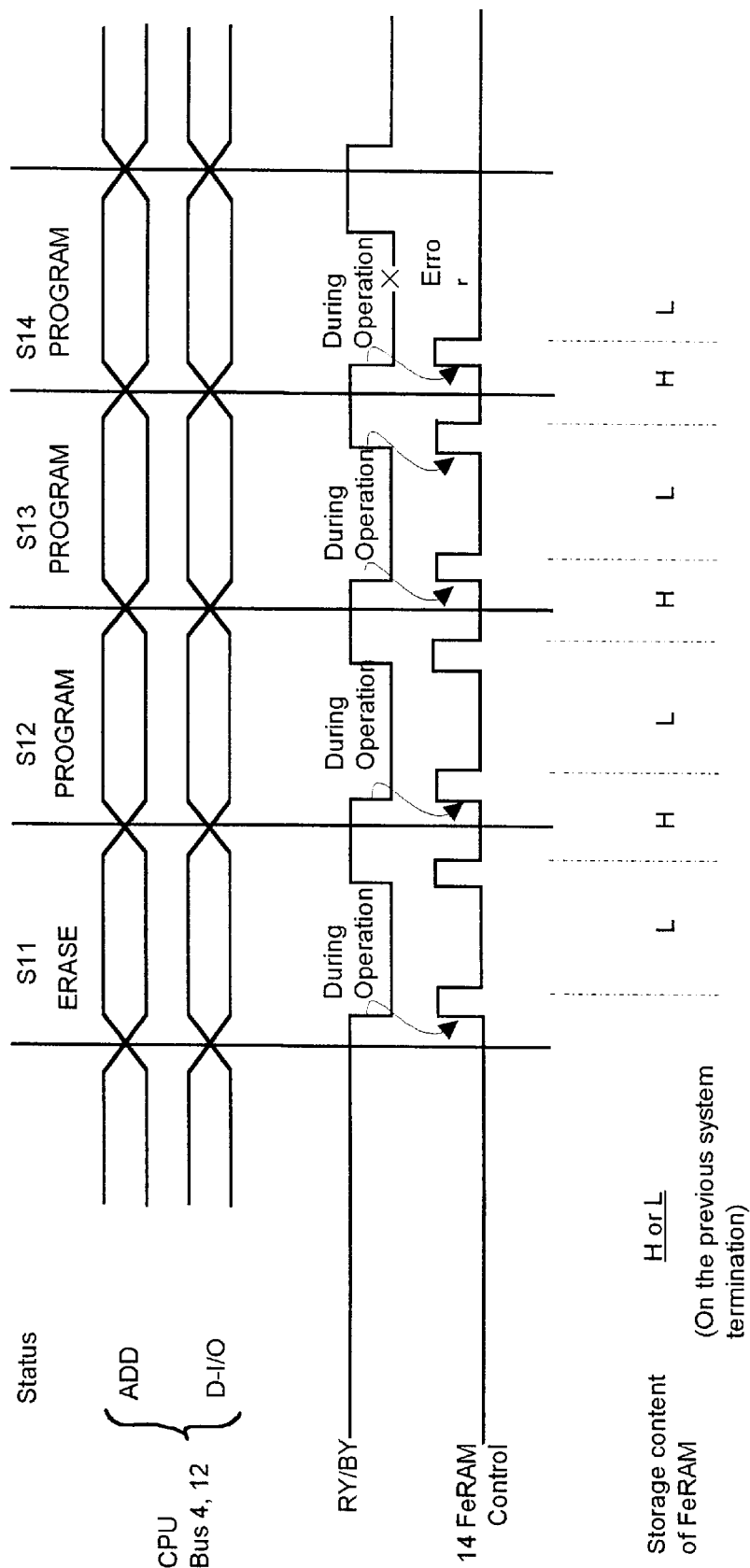
FIG. 9 is an operational timing chart of the electric device of FIG. 8.

FIG. 9 is an operational timing chart of the example of FIG. 8. As is described above, at the erase or program operation, the ready busy signal RY/BY goes to level L during the operation, and goes to level H after completing the operation. Therefore, in a case where the system is down due to the error occurrence, it becomes possible to know whether or not the error occurs during the erase or program operation, by recording the status of the ready busy signal RY/BY in the auxiliary non-volatile memory 10. Recording the information makes it possible to know whether or not the erase or program operation should be executed again, when the system is recovered.

As is shown in FIG. 9, at the time when the ready busy signal RY/BY goes from level H to level L or from level L to level H, the control circuit 1 makes the auxiliary non-volatile memory 10 record the status of the ready busy signal RY/BY according to the FeRAM control signal 14. Therefore, it becomes possible to detect whether an error occurs during the operation (if RY/BY is level L), or an error occurs after completing the operation (if RY/BY is level H), by checking the last ready busy signal RY/BY recorded in the auxiliary non-volatile memory 10, when the system is recovered after the error occurrence. In other words, it becomes possible to detect whether or not the operation is normally finished. Additionally, as only one bit of the ready busy signal BY/RY is recorded in the auxiliary non-volatile memory 10, it becomes possible to reduce the storage capacity of the auxiliary non-volatile memory 10.

Figure 10:
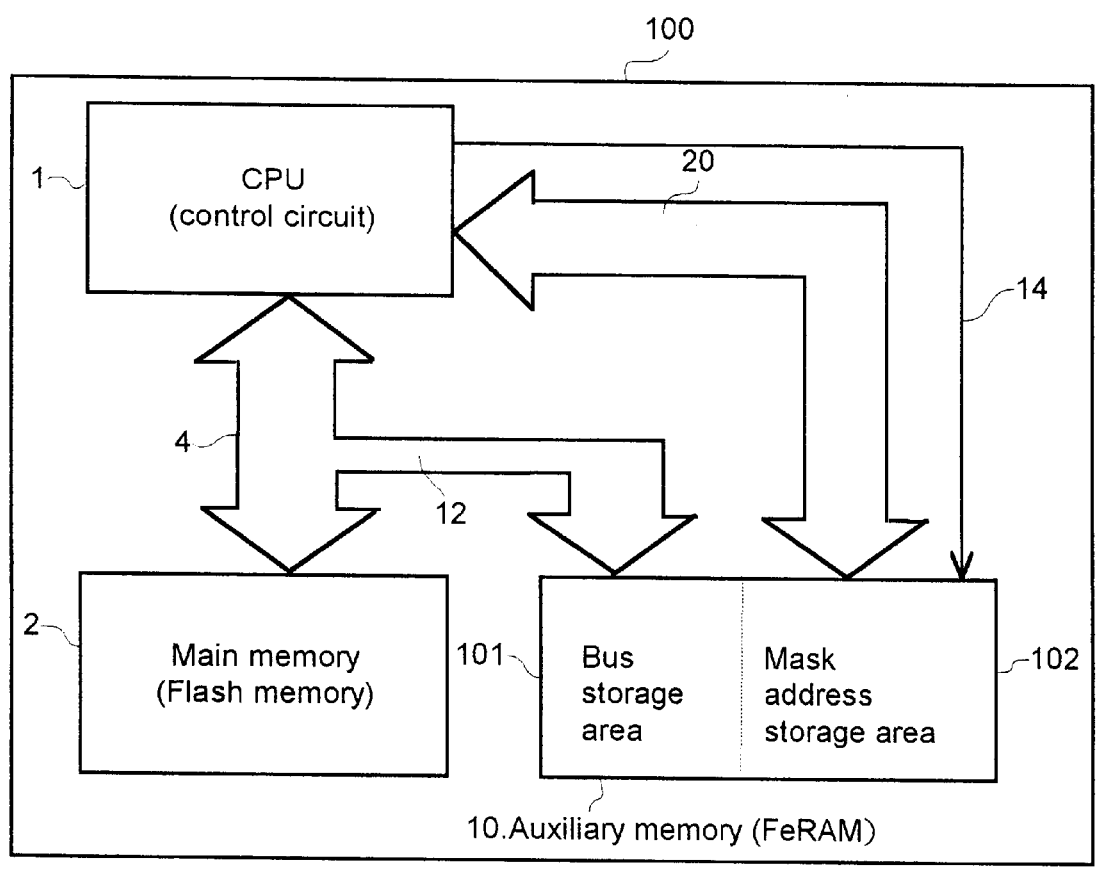
FIG. 10 is a structural diagram of an electric device of a fourth embodiment according to the present invention.

FIG. 10 is a structural diagram of the electrical device of a fourth embodiment according to the present invention. In the fourth embodiment, the auxiliary non-volatile memory 10 includes a bus storage area 101 and a mask address area 102. Information of the bus 12 branched from the bus 4 is recorded in the bus storage area 101 at the above-described prescribed timing. On the other hand, an address at the time the program or erasing operation becomes defective is recorded in the mask address area 102. Then, the bus information in the bus storage area 101 is read out for an automatic analysis when the system is recovered, and used for an operation after the system recovery. On the other hand, the address recorded in the mask address area 102 is read out from the control circuit 1 after recovering the system, and it is inhibited to access the address after that.

Figure 11:
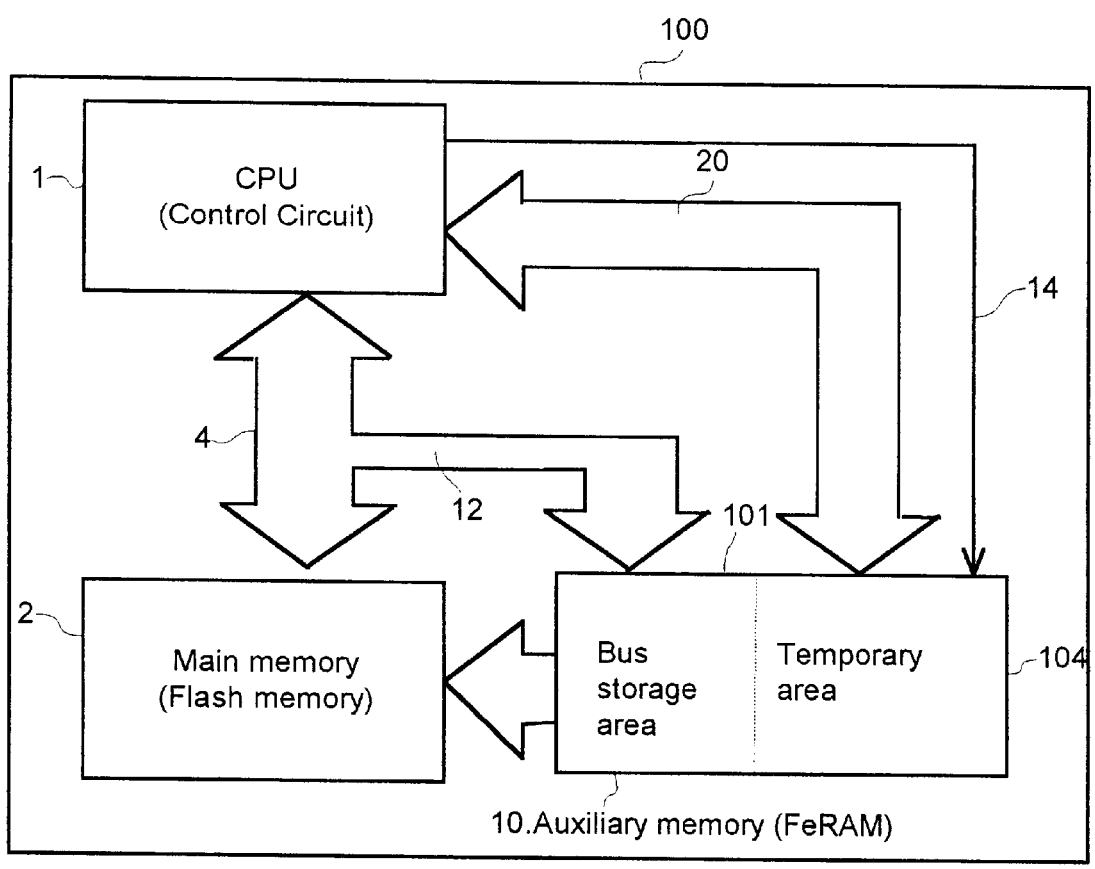
FIG. 11 is a structural diagram of an electric device of a fifth embodiment according to the present invention.

FIG. 11 is a structural diagram of the electrical device of a fifth embodiment of the present invention. In the fifth embodiment, the auxiliary non-volatile memory 10 includes a bus storage area 101 and a temporary area 104. Bus information is recorded in the bus storage area 101 at the prescribed timing, similarly to that of FIG. 10. The temporary area 104 is used to temporally record write data or to record attribute data of the memory card, similarly to that of the temporary memory 3 described in the prior art. It becomes possible to give a function equivalent to that of the conventional temporary memory 3 to the temporary area 104 by using the FeRAM, by which write or read operation can be executed in high speed, without using a buttery.

Figure 12:
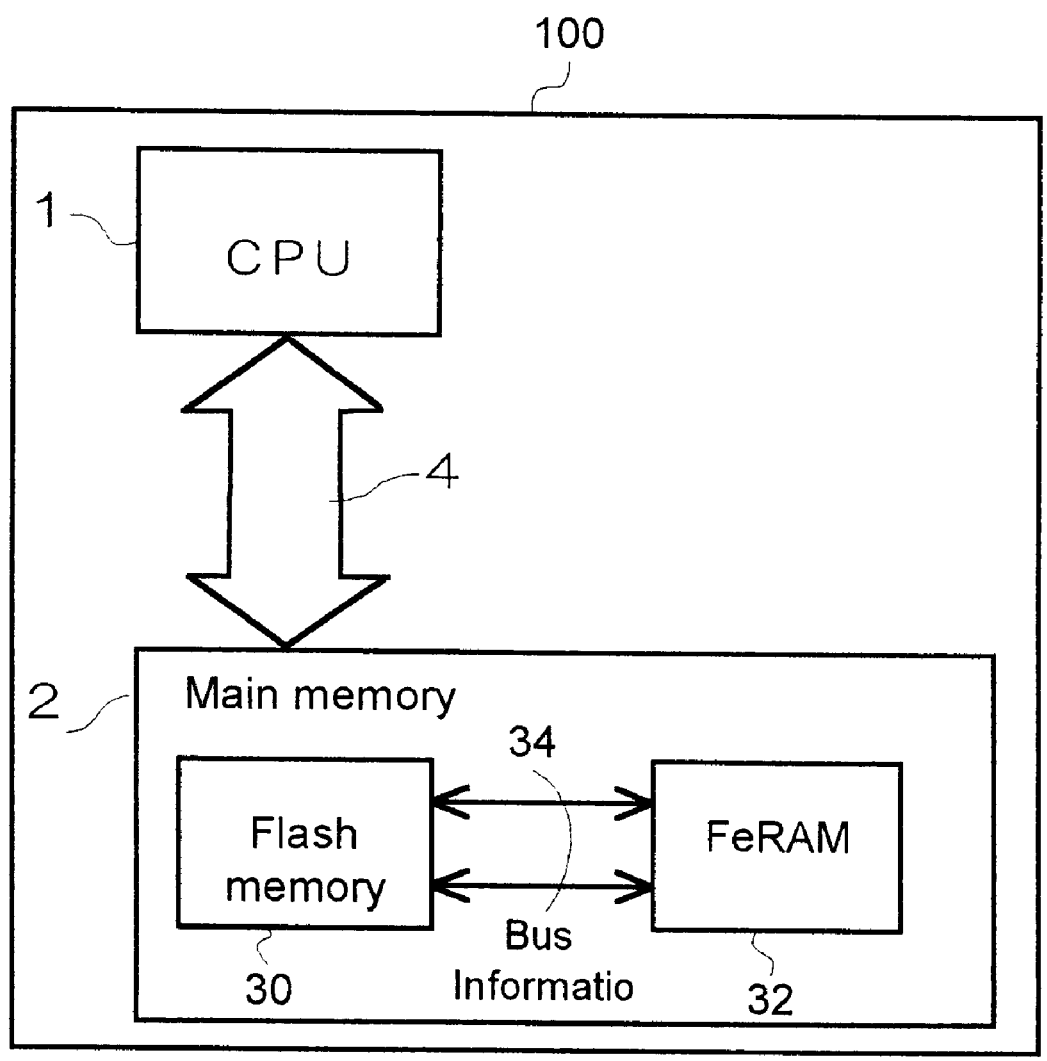
FIG. 12 is a structural diagram of an electric device of a sixth embodiment according to the present invention.
Figure 13:
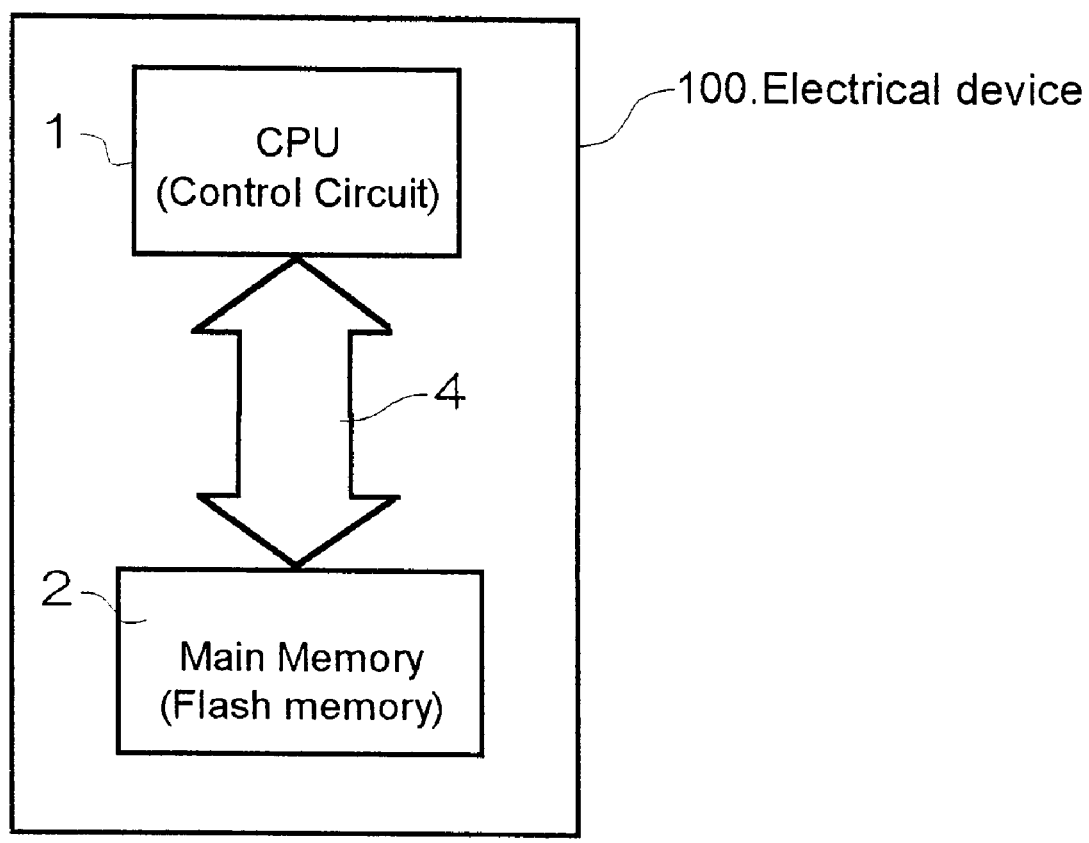
FIG. 13 is a structural diagram of an electric device having the conventional flash memory.
Figure 14:
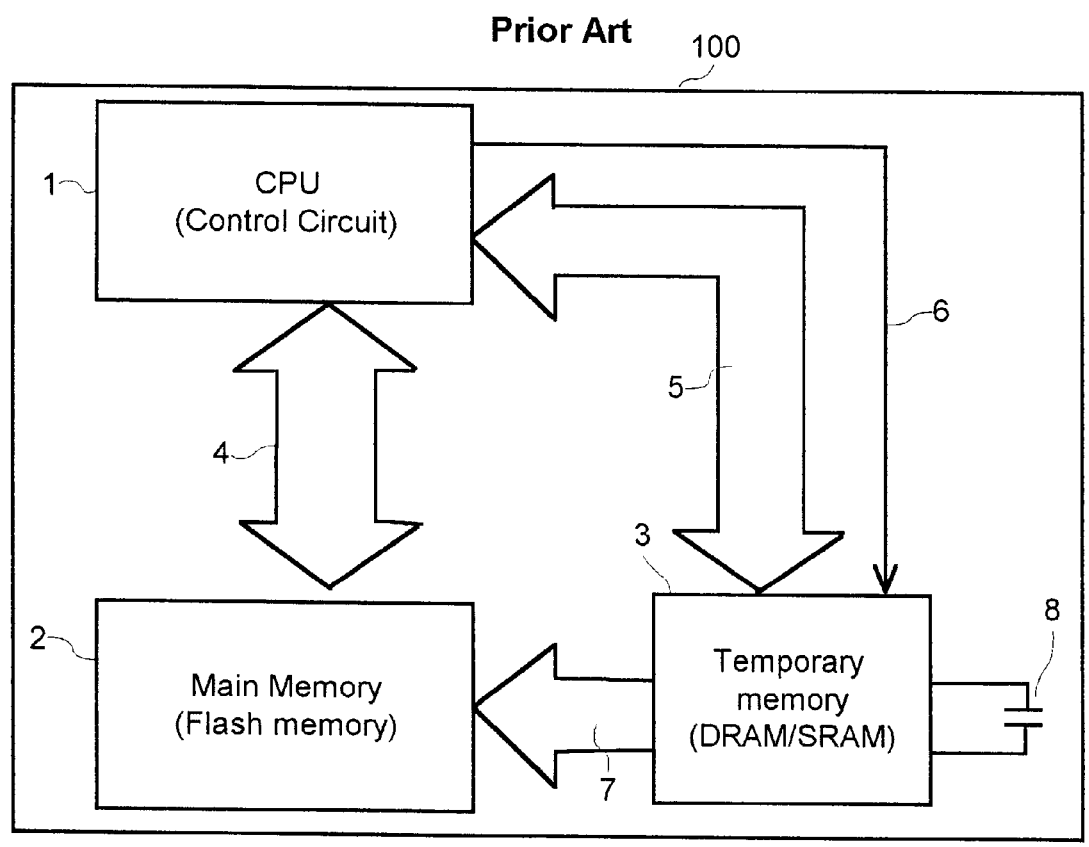
FIG. 14 is a structural diagram of an electric device having the conventional flash memory.

FIG. 12 is a structural block diagram of the electrical device of a sixth embodiment. In the sixth embodiment, an auxiliary non-volatile memory 32 composed of a FeRAM is provided on the same chip of the main memory 2 formed of a flash memory area 30. Therefore, the bus information supplied to the flash memory area 30 is supplied to the auxiliary non-volatile memory 32 through a connection line 34, and the bus information is recorded at a prescribed timing.

As is explained above, according to the present invention, even if an error occurs during erase or program operation, bus information just before the error occurrence is recorded in a flash memory, which requires a long time to execute program or erase operation. Therefore, an analysis of the bus information recorded in the auxiliary non-volatile memory after recovering the system makes it possible to easily know an operation status at the error occurrence and makes it possible to simplify the operation after the system is recovered.

What is claimed is:

1. An electrical device including a flash memory and a control section connected to the flash memory through a bus for supplying control commands via the bus to control the flash memory, comprising:

an auxiliary non-volatile memory having a faster write operation than the flash memory, wherein the control section causes the auxiliary non-volatile memory to record the control commands supplied to the bus at a prescribed timing.

2. The electrical device according to claim 1, wherein the control section causes the auxiliary non-volatile memory to record to control commands supplied to the bus, when instructing program or erasing operation to the flash memory.

3. The electrical device according to claim 2, wherein the control section instructs the program or erase operation by supplying a combination of prescribed commands throughout plural cycles, and causes the auxiliary non-volatile memory to record the control commands in each of the plural cycles.

4. The electrical device according to claim 2, wherein the control section causes the auxiliary non-volatile memory to record the control commands supplied to the bus, in response to a flag signal showing the operation is executing, which the flash memory returns in response to the instruction of the program or erase operation.

5. The electrical device according to claim 1, wherein the control section causes the auxiliary non-volatile memory to record the bus information, in response to a flag signal informing the operation failure, which the flash memory returns when an error occurs during the program or erase operation.

6. The electrical device according to claim 1, wherein the control section causes the auxiliary non-volatile memory to record write data to the flash memory or attribute information of the electrical device.

7. An electrical device having a flash memory and a control section connected to the flash memory through a bus for supplying control commands via the bus so as to control the flash memory, comprising:

an auxiliary non-volatile memory having a faster write operation than the flash memory, wherein the control section instructs program or erase operation to the flash memory, and records histories of flag signals informing that the operation is executing or the operation is completed, which the flash memory returns in response to the instruction, in the auxiliary non-volatile memory.

8. An electrical device having a flash memory and a control section connected to the flash memory through a bus for supplying control commands through the bus to control the flash memory, comprising:

an auxiliary non-volatile memory having a faster write operation than the flash memory, wherein the control section records an address when the program or erase operation becomes defective in the flash memory in auxiliary non-volatile memory and inhibits executing program or erase operation to the recorded address.

9. The electrical device according to any one of claims 1 through 8, wherein the auxiliary non-volatile memory is a ferroelectric RAM (FeRAM).

* * * * *